US010840431B2

(12) United States Patent
Karpov et al.

(10) Patent No.: US 10,840,431 B2
(45) Date of Patent: *Nov. 17, 2020

(54) MULTILAYER SELECTOR DEVICE WITH LOW HOLDING VOLTAGE

(71) Applicant: Intel Corporation, Santa Clara, CA (US)

(72) Inventors: Elijah V. Karpov, Portland, OR (US);
Ravi Pillarisetty, Portland, OR (US);
Prashant Majhi, San Jose, CA (US);
James S. Clarke, Portland, OR (US);
Uday Shah, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 114 days.

This patent is subject to a terminal disclaimer.

(21) Appl. No.: 16/077,741

(22) PCT Filed: Mar. 31, 2016

(86) PCT No.: PCT/US2016/025439
§ 371 (c)(1),
(2) Date: Aug. 14, 2018

(87) PCT Pub. No.: WO2017/171823
PCT Pub. Date: Oct. 5, 2017

(65) Prior Publication Data
US 2019/0074429 A1    Mar. 7, 2019

(51) Int. Cl.
*G11C 11/16*  (2006.01)
*H01L 45/00*  (2006.01)
(Continued)

(52) U.S. Cl.
CPC ............ *H01L 43/02* (2013.01); *G11C 11/161* (2013.01); *G11C 11/1659* (2013.01);
(Continued)

(58) Field of Classification Search
CPC ... H01L 29/127; H01L 29/423; H01L 29/165; H01L 27/18; G11C 13/003;
(Continued)

(56) References Cited

U.S. PATENT DOCUMENTS 6,348,365 B1    2/2002 Moore
2006/0181920 A1    8/2006 Ufert
(Continued)

FOREIGN PATENT DOCUMENTS

WO    2017111894 A1    6/2017

OTHER PUBLICATIONS

U.S. Patent and Trademark Office, Office Action dated Sep. 5, 2019, with Reply filed Nov. 14, 2019, in U.S. Appl. No. 16/077,760, 25 pages total.
(Continued)

*Primary Examiner* — Hien N Nguyen
(74) *Attorney, Agent, or Firm* — Trop, Pruner & Hu, P.C.

(57) ABSTRACT

An embodiment includes an apparatus comprising: a memory array comprising: a selector switch including top and bottom electrodes, a metal layer, and a solid electrolyte layer; a memory cell in series with the selector switch; bit and write lines, wherein (a) (i) the top electrode couples to one of the bit and write lines and the bottom electrode couples to another of the bit and write lines, and (a) (ii) the memory cell is between one of the top and bottom electrodes and one of the bit and write lines; wherein (b) (i) the metal layer includes silver (Ag), and (b) (ii) Ag ions from the metal layer form a conductive path in the SE layer when the top electrode is biased and disband the conductive path when the top electrode is not biased. Other embodiments Electrode are described herein.

22 Claims, 8 Drawing Sheets

(51) Int. Cl.
*H01L 43/02* (2006.01)
*H01L 27/22* (2006.01)
*H01L 43/10* (2006.01)
*G11C 13/00* (2006.01)

(52) U.S. Cl.
CPC ............ *H01L 27/228* (2013.01); *H01L 43/10* (2013.01); *G11C 13/003* (2013.01); *G11C 2213/76* (2013.01)

(58) Field of Classification Search
CPC .............. G11C 11/161; G11C 11/1659; G11C 13/0026; G11C 13/0028; G11C 7/18; G11C 8/14; G11C 11/16
See application file for complete search history.

(56) References Cited

U.S. PATENT DOCUMENTS

| | | |
|---|---|---|
| 2006/0265548 A1 | 11/2006 | Symanczyk et al. |
| 2008/0006810 A1 | 1/2008 | Park |
| 2008/0273370 A1 | 11/2008 | Keller et al. |
| 2010/0084741 A1 | 4/2010 | Andres et al. |
| 2010/0265757 A1 | 10/2010 | Otsuka |
| 2011/0001108 A1* | 1/2011 | Greene ............ H03K 19/17724 257/2 |
| 2011/0007544 A1 | 1/2011 | Vaithyanathan et al. |
| 2011/0121254 A1* | 5/2011 | Dressler ................ H01L 45/085 257/4 |
| 2012/0138884 A1 | 6/2012 | Tian et al. |
| 2012/0250395 A1 | 10/2012 | Nodin |
| 2013/0134382 A1 | 5/2013 | Martens et al. |
| 2013/0175494 A1 | 7/2013 | Collins et al. |
| 2013/0264534 A1 | 10/2013 | Hwang et al. |
| 2013/0286712 A1 | 10/2013 | Liu et al. |
| 2013/0306930 A1 | 11/2013 | Sills |
| 2014/0209892 A1 | 7/2014 | Kuo et al. |
| 2014/0264252 A1 | 9/2014 | Hashim et al. |
| 2015/0090947 A1 | 4/2015 | Marsh |
| 2015/0123066 A1 | 5/2015 | Gealy et al. |
| 2015/0263069 A1 | 9/2015 | Jo |
| 2019/0058115 A1* | 2/2019 | Karpov ................. H01L 45/085 |

OTHER PUBLICATIONS

U.S. Patent and Trademark Office, Final Office Action dated Dec. 2, 2019, with Reply filed Jan. 30, 2020, in U.S. Appl. No. 16/077,760, 17 pages total.
The International Searching Authority, Written Opinion of the International Searching Authority and the International Search Report dated Dec. 21, 2016 in International Application No. PCT/US2016/025437, 12 pages.
Wang et al., "Non-volatile CBRAM_Crossbar based 3D-Integrated Hybrid memory for Data Retention", IEEE Transactions on Very Large Scale Integration Systems (TVSI), 2013, pp. 957-970, vol. 22, Issue 5, Institute of Electrical and Electronics Engineers.
Wikipedia, "Programmable metallization cell", Feb. 29, 2016, 5 pages, https://en.wikipedia.org/wiki/Programmable_metallization_cell.
Wikipedia, "Noble metal", Feb. 29, 2016, 4 pages, https://en.wikipedia.org/wiki/Noble_metal.
Wikipedia, "Monolayer", Mar. 1, 2016, 3 pages, https://en.wikipedia.org/wiki/Monolayer.
Solid State Technology, "#10: Visualizing CBRAM Filaments", Feb. 29, 2016, http://electroiq.com/blog/2012/12/10-visualizing-cbram-filaments/.
Xu et al., "Investigation of LRS dependence on the retention of HRS in CBRAM", Nanoscale Research Letters, 2015, pp. 1-6, vol. 10, Issue 61, Springer.
Yahya et al., "Designing Low-Vth STT-RAM for Write Energy Reduction in Scaled Technologies", 16th international Symposium on Quality Electronic Design, 2015, pp. 5-9, Institute of Electrical and Electronics Engineers.
U.S. Appl. No. 15/755,566, filed Feb. 27, 2018, entitled "Self-Aligned Memory Array" by Elijah V. Karpov, et al.
The International Searching Authority, Written Opinion of the International Searching Authority and the International Search Report dated Dec. 16, 2016 in International Application No. PCT/US2016/025433, 12 pages.
The International Searching Authority, Written Opinion of the International Searching Authority and the International Search Report dated Dec. 22, 2016 in International Application No. PCT/US2016/025439, 9 pages.

* cited by examiner ue: 10,840,431 B2

MULTILAYER SELECTOR DEVICE WITH LOW HOLDING VOLTAGE

TECHNICAL FIELD

Embodiments of the invention are in the field of semiconductor devices and systems.

BACKGROUND

Selection/selector devices are found in many different forms. For example, selector devices may replace transistors in non-volatile memory arrays. Selector devices may be used in phase change memory (PCM) arrays. Selector devices may use various materials, such as chalcogenide glass, which exhibit volatile transition from a non-conductive state to a conductive state based on how the devices are biased. Other selector devices may use a metal-insulator-transition (MIT) material or Mott transition material. Such selector devices, however, often have unacceptable leakage current, relatively high holding voltages, and/or relatively high threshold voltages, any of which may lead to power inefficiency and/or overall poor product performance.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Embodiments include an embedded non-volatile memory (eNVM) multilayer selector device with a relatively low holding voltage ($V_h$) and/or a relatively low threshold voltage ($V_{th}$) (also sometimes referred to herein as $V_t$). Such selector switches or devices may be included in transistorless memory arrays. Such selector switches or devices may be included in transistorless memory arrays that include magnetic tunnel junctions (MTJs) used in spin torque transfer random access memory (STTRAM). Such selector switches may be included in systems with field effect transistors that rely on selectors with low $V_h$ and/or $V_{th}$ to form a three terminal device called a HP-FET.

Figure 1:
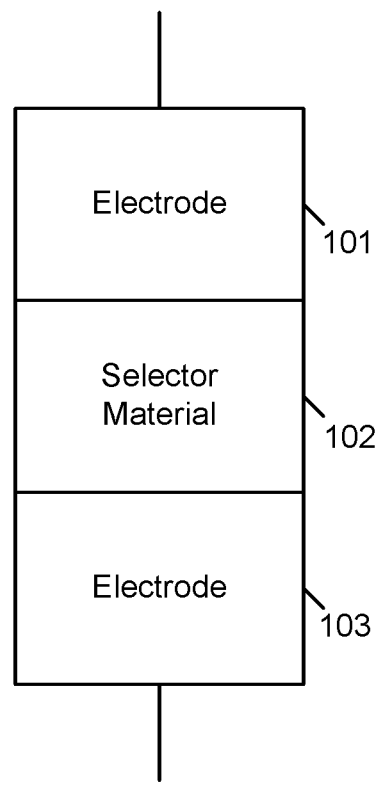
FIG. 1 includes a conventional switching device.

Such embodiments provide an improvement over conventional selector switches such as chalcogenide glass-based threshold switches that are directly sandwiched between two electrodes. For example, FIG. 1 discloses such a conventional switch with selector material 102 (which includes a chalcogenide glass-based material) between electrodes 101, 103. Device 100 exhibits high $V_t$ and $V_h$, poor leakage current, and a low $I_{on}/I_{off}$ ratio at V/2 (which is 1/2 of the threshold voltage needed to transition the selector material to its conducting state).

Figure 2:
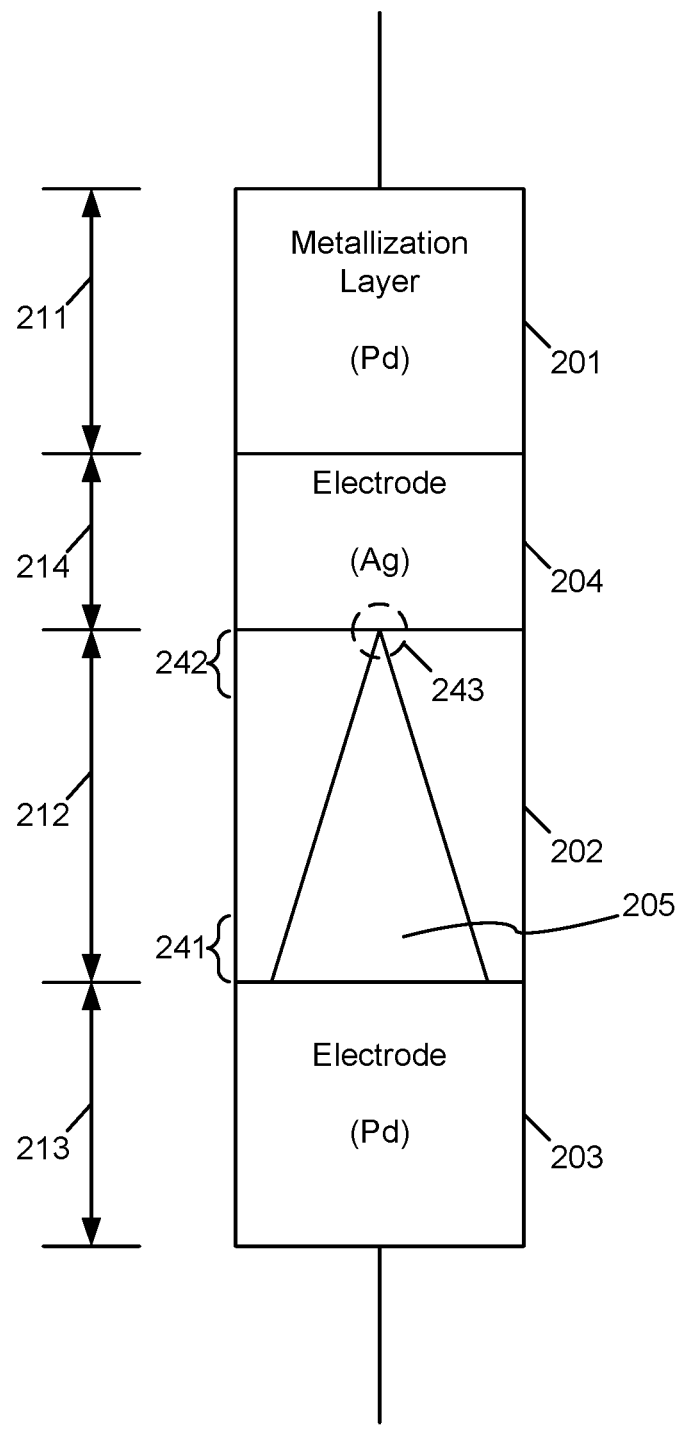
FIG. 2 includes a switching device in an embodiment.

In contrast, FIG. 2 includes an embodiment with a selector stack that has a low $V_t$ and $V_h$, high $I_{on}/I_{off}$ ratio at V/2 (e.g., 1E6). Electrode layer 204 provides materials for a metal filament (e.g., Ag), such as the filament used in programmable metallization cell (PMC) memory cells (also sometimes referred to as conductive bridge random access memory (CBRAM)). Layer 204 may include Ag, and alloys or intermetallic compounds thereof in various embodiments (e.g., an alloy of Ag and one or more members selected from the group comprising: Pd, Ir, and Pt), (e.g., an alloy of Ag and one or more members selected from the group including Zn, Ti, Al, W, Si, and Ni). Layers 201, 203 may be referred to as electrodes and/or metallization layers and/or contacts. Layers 201, 203 may include, for example, noble or high work function metals including Ru, Rh, Pd, Ir, Pt. Layers 201, 203 may have multiple layers and, in some embodiments, those layers may be alternating (e.g., alternating layers of Pd and another metal).

As a brief aside, an alloy is a mixture of metals or a mixture of a metal and another element. Alloys are defined by their metallic bonding character. An alloy may be a solid solution of metal elements (a single phase) or a mixture of metallic phases (two or more solutions). Intermetallic compounds are alloys with a defined stoichiometry and crystal structure. Specifically, an intermetallic compound is any solid material, composed of two or more metal atoms in a definite proportion, which has a definite structure which differs from those of its constituent metals. For instance, an alloy is a solution of two or more components but there is no order in bonding between the components and the composition of the alloy can vary without much impact on the properties (e.g., strength, electrical resistance) of the alloy. However, an intermetallic compound is more ordered, with a defined stoichiometry and bond structure. As used herein, an intermetallic compound is a type of alloy.

Layer 202 may include a solid electrolyte ($Al_2O_3$, $HfO_2$, $SiO_2$, $ZrO_2$, $TiO_2$, $SiO_2$, $WO_3$, and the like) within which a metal filament 205 may form from the metal of layer 204. The electrolyte may include a low density, porous oxide. In some embodiments layer 202 includes a layer or layers deposited using low temperature atomic layer deposition (ALD) to form a thin, uniform layer or layers with reduced density and increased porosity, but other embodiments are not so limited and may use, for example, sputtering and the like. In some embodiments layer 202 may include stoichiometric oxides (e.g., $Al_2O_3$, $HfO_2$, $Nb_2O_5$) and/or substoichiometric oxides (e.g., NbOx, TiOx, HfOx, AlOx).

Height 212 may be 2 nm but in other embodiments is 1, 3, 4, 5 nm or more. Height 214 may be 2 nm but in other embodiments is 1, 3, 4, 5 nm or more. In contrast, heights 211, 213 may each be 5 nm thick or more.

Switch 200 is a two terminal selector device. The switch relies on reduction/oxidation (redox) reactions to form and dissolve conductive filament 205. The state of the switch is determined by the resistance across the two terminals 201, 203. The existence of a filament 205 between the terminals produces a low resistance state (LRS) (switch is "ON") while the absence of a filament (or presence of an incomplete filament) results in a high resistance state (HRS) (switch is "OFF"). More specifically, the selector switches from a low to a high resistive state (by disbanding or disrupting the filament 205) and from a high to a low resistive state (by reforming the filament 205). When the voltage across terminals 201, 203 is above $V_{th}$, the device is in ON state and when no bias is applied across terminals 201, 203 the device is in the OFF state.

Figure 3:
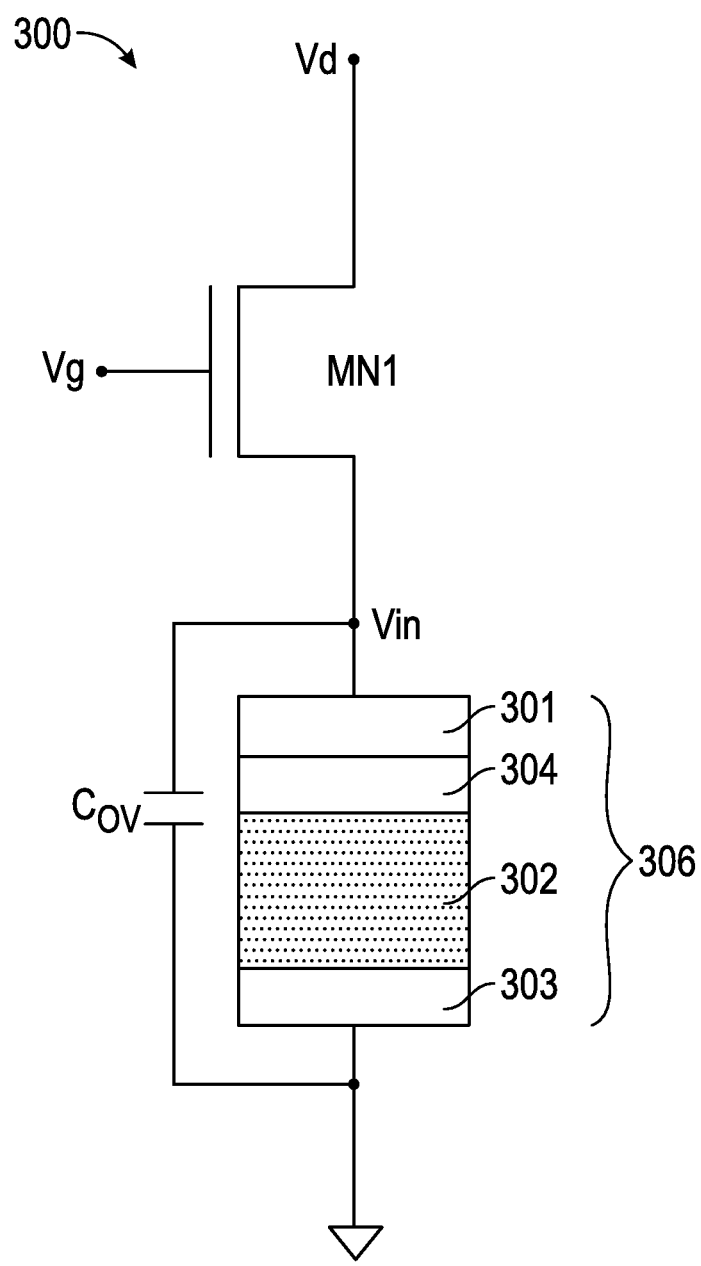
FIG. 3 includes a hybrid phase field effect transistor (HP-FET) in an embodiment.

FIG. 3 illustrates a HP-FET having a multi-layer threshold switch. The n-type HP-FET 300 comprises an n-type transistor MN1 and a multi-layer threshold switch 306 coupled in series with the transistor MN1.

In some embodiments, multi-layer threshold switch 306 is a two terminal device. In some embodiments, the first terminal 301 of multi-layer threshold switch 306 is coupled to a source terminal $V_{in}$ of transistor MN1 while the second terminal 303 of multi-layer threshold switch 306 is coupled to ground or to a load device. As such, n-type HP-FET 300 forms a four terminal device with a gate terminal coupled to $V_g$, drain terminal coupled to $V_d$, source terminal coupled to a terminal of multi-layer threshold switch 306, and a bulk or substrate terminal of transistor MN1. Here, $C_{OV}$ is the overlap capacitance due to the source region of transistor MN1 and due to multi-layer threshold switch 306. In some embodiments, the drain terminal $V_d$ of transistor MN1 is coupled to another circuit or supply node $V_{dd}$. Here, labels for signals and nodes are interchangeably used. For example, the term "Vg" may refer to voltage Vg or node Vg depending on the context of the sentence.

In some embodiments, multi-layer threshold switch 306 has a variable resistance with a high resistance bound above which the transistor MN1 does not turn on. In some embodiments, the high resistance bound of multi-layer threshold switch 306 is given by the resistance of transistor MN1 in the OFF state (i.e., $R_{OFF}$) divided by the factor of $(V_d/V_{th})$ where "$V_d$" is applied source drain bias across these two devices (i.e., transistor MN1 and multi-layer threshold switch 306) in series, and where "$V_{th}$" is a threshold voltage of multi-layer threshold switch 306.

In some embodiments, multi-layer threshold switch 306 has a low resistance bound below which the transistor MN1 does not turn off. In some embodiments, the low resistance bound is given by the resistance "$R_{on}$" of transistor MN1 in the ON state divided by the factor of $(V_d/V_h)$, where "$V_h$" is a holding voltage of multi-layer threshold switch 306 below which multi-layer threshold switch 306 becomes resistive. As such, in some embodiments, the OFF current of HP-FET 300 is set by the high resistance bound of multi-layer threshold 306 while the ON current of HP-FET 300 is set by the maximum current that the transistor MN1 can drive.

Other embodiments include a p-type HP-FET whereby instead of using an n-type transistor a p-type transistor MP1 is used.

FIG. 3 illustrates n-type HP-FET 300 showing the cross-section of multi-layer threshold switch 306, in accordance with some embodiments. In some embodiments, a cross-section of multi-threshold device 306 includes a first electrode 301 (e.g., Pd) or metallization layer, a second active electrode 304 (e.g., Ag), a solid electrolyte layer 302 (e.g., $Al_2O_3$), and a third or additional electrode 303 (e.g., Pd). In some embodiments, first electrode 301 is coupled to the source terminal of transistor MN1. In some embodiments, electrode layer 304 is connected directly to layer 302. Electrode layer 304 may connect directly to layer 301, but in other embodiments may be separated from layer 301 by a barrier layer. In some embodiments, the electrode 303 provides the source terminal of HP-FET 300.

Materials for the layers 303, 302, 304, 301 (respectively analogous to layers 203, 202, 204, 201 of FIG. 2) are as described above with regard to FIG. 2.

In some embodiments, multi-layer threshold switch 306 has two states—conductive state and non-conductive state. In some embodiments, the two states are switched according to a bias voltage applied across the two terminals 301, 303 of multi-layer threshold switch 306. In some embodiments, for the case where the initial or current condition of multi-layer threshold switch 306 is a non-conductive state, as voltage across multi-layer threshold switch 306 rises to threshold voltage $V_t$ (e.g., less than 0.5V, such as 0.1, 0.15, 0.2 V), multi-layer threshold switch 306 switches from a non-conductive state to a conductive state. At that state, the minimal current is higher than $I_h$, which is substantially non-zero. This is the ON state where current is limited by the transistor in series.

In some embodiments, when the initial or current condition of multi-layer threshold switch 306 is a conductive state, as voltage across multi-layer threshold switch 306 reduces and reaches a holding voltage $V_h$ (e.g., less than 0.5V, such as 0.2, 0.3, 0.4 V), multi-layer threshold switch 306 switches from a conductive state to a non-conductive state. At that state, the current is less than $I_t$, which is substantially zero. The slope of a related IV curve above $V_t$ is the resistance of multi-layer threshold switch 306 in the conductive state (i.e., $R_{metallic}$), while the slope of the IV curve below $V_t$ is the resistance of multi-layer threshold switch 306 in the non-conductive state (i.e., $R_{insulating}$). In some embodiments, the threshold and holding voltages $V_t$ (sometimes referred to as $V_{th}$) and $V_h$, respectively, are selected such that the OFF current of HP-FET 300 is set by the high resistance bound of multi-layer threshold switch 306 while the ON current of HP-FET 300 is set by the maximum current that the transistor MN1 can drive.

Switch 306 may directly contact a node or pad or contact of MN1 or may be located several metal layers above transistor MN1 and may only contact transistor MN1 indirectly through vias.

Figure 4:
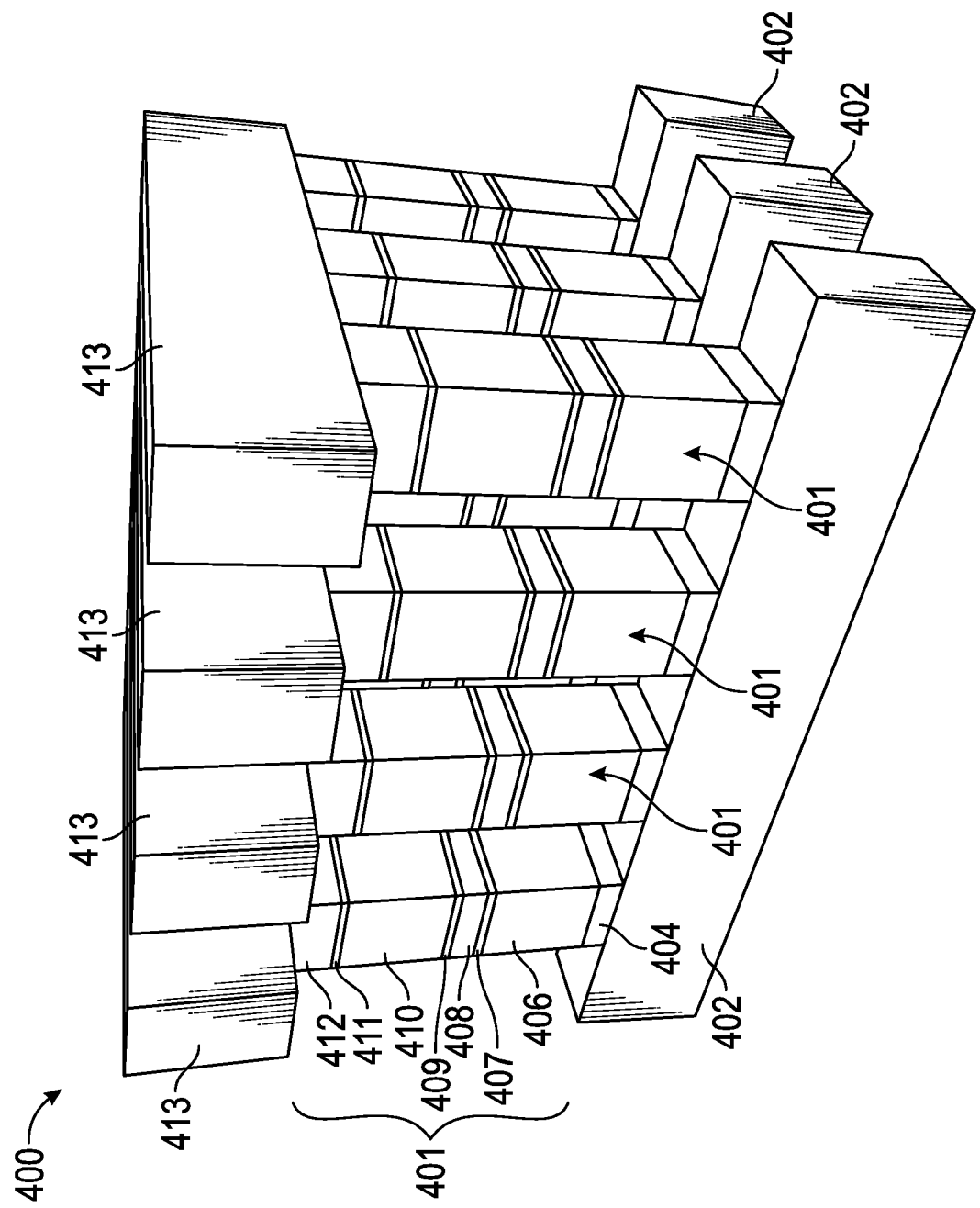
FIG. 4 includes a transistorless non-volatile memory in an embodiment.

FIG. 4 includes a transistorless non-volatile memory array 400. More specifically, FIG. 4 depicts a perspective view of one exemplary embodiment of a portion of a chalcogenide-based phase-change cross point memory array 400. Cross-point memory 400 can be, but is not limited to, part of a solid-state memory array or a solid-state drive. Cross point memory 400 comprises a plurality of memory cells 401 that are each arranged in a column (or pillar), of which only a few are indicated. Additionally, it should be understood that a dielectric material that is normally between memory cells 401 is not shown in FIG. 4 for clarity.

Each memory cell 401 comprises an electrode 404 (e.g., Pd) formed on a word line metallization 402. An ALD deposited solid electrolyte (e.g., $HfO_2$, $Al_2O_3$, $Nb_2O_5$, and the like) 406 is formed on electrode 404. Electrode layer 407 (e.g., Ag) is formed on layer 406. Layer 407 may provide the metal to form a metal filament in layer 406, as described with regard to FIG. 2. In some embodiments layers 406, 407 directly contact each other. An electrode/metallization layer 408 (e.g., Pd) is formed on electrode layer 407.

An embodiment forms an electrode-chalcogenide interface layer 409 on electrode 408. Layer 409 may include tungsten and/or molybdenum carbide and/or boride interface layers. The interface layer formed between an electrode layer 408 and chalcogenide layer 410 provides a reduced resistance in comparison to an electrode-chalcogenide interface without a carbide- and/or boride-based interface layer. Interface layers such as layers 409, 411 are described more fully in U.S. Patent Application Publication Number 20150123066, assigned to Intel Corp. of Santa Clara, Calif., USA and are included in some but not all memory related embodiments described herein. A chalcogenide memory cell (MC) 410 is formed on interface layer 409. An electrode-chalcogenide interface layer 411 is formed on MC 410. An electrode 412 is formed on interface layer 411. A bit line metallization layer 413 is formed on electrode 412.

The memory cell (layers 409, 410, 411, 412) is not limited to PCM. Other memory element options are, for example, PMC memory cells. Other memory element options are, for example, HfOx or TaOx based resistive RAM (RRAM) based on oxygen vacancy based filaments, or other resistive switching memories.

In embodiments, word line metallization layer 402 and bit line metallization layer 413 are formed from, for example, tungsten, copper and/or aluminum. In one exemplary embodiment, electrode layer 412 is a composite electrode that is formed from, for example, carbon (C) and/or titanium nitride (TiN).

In an embodiment, electrode-chalcogenide interface layers 409 and 411 are formed from carbides and/or borides of tungsten (W) and/or molybdenum (Mo). In one exemplary embodiment, interface layers 409 and 411 are formed by using, for example, a reactive physical vapor deposition (PVD) (e.g., reactive sputtering) from W/Mo targets using unsaturated organic carbon compounds, such as benzene and acetylene. In another exemplary embodiment, interface layers 409 and 411 are formed non-reactively by being sputtered from W/Mo carbide and boride targets. Although interface layers 409 and 411 are depicted in FIG. 4, it should be understood that alternative exemplary embodiments may have fewer (e.g., 0 or 1) or more interface layers (e.g., 2 or more).

FIG. 4 depicts a schematic diagram of an exemplary embodiment of a cross-point memory array 400 comprising a plurality of memory cells 401. Memory cells 401 are located at intersections of column signal lines 402 (e.g., word lines) and row signal lines 413 (e.g., bit lines). Individual column and/or row signal lines are electrically connected in a well-known manner to a memory controller (not shown) to selectively operate memory cells 401 in a well-known manner. It should be understood that memory array 400 can comprise part of a solid-state memory array or a solid-state drive that is coupled in a well-known manner to a computer system or an information-processing system (not shown).

Materials for the layers 404, 406, 407, 408 (respectively analogous to layers 203, 202, 204, 201 of FIG. 2) are as described above with regard to FIG. 2.

Figure 5:
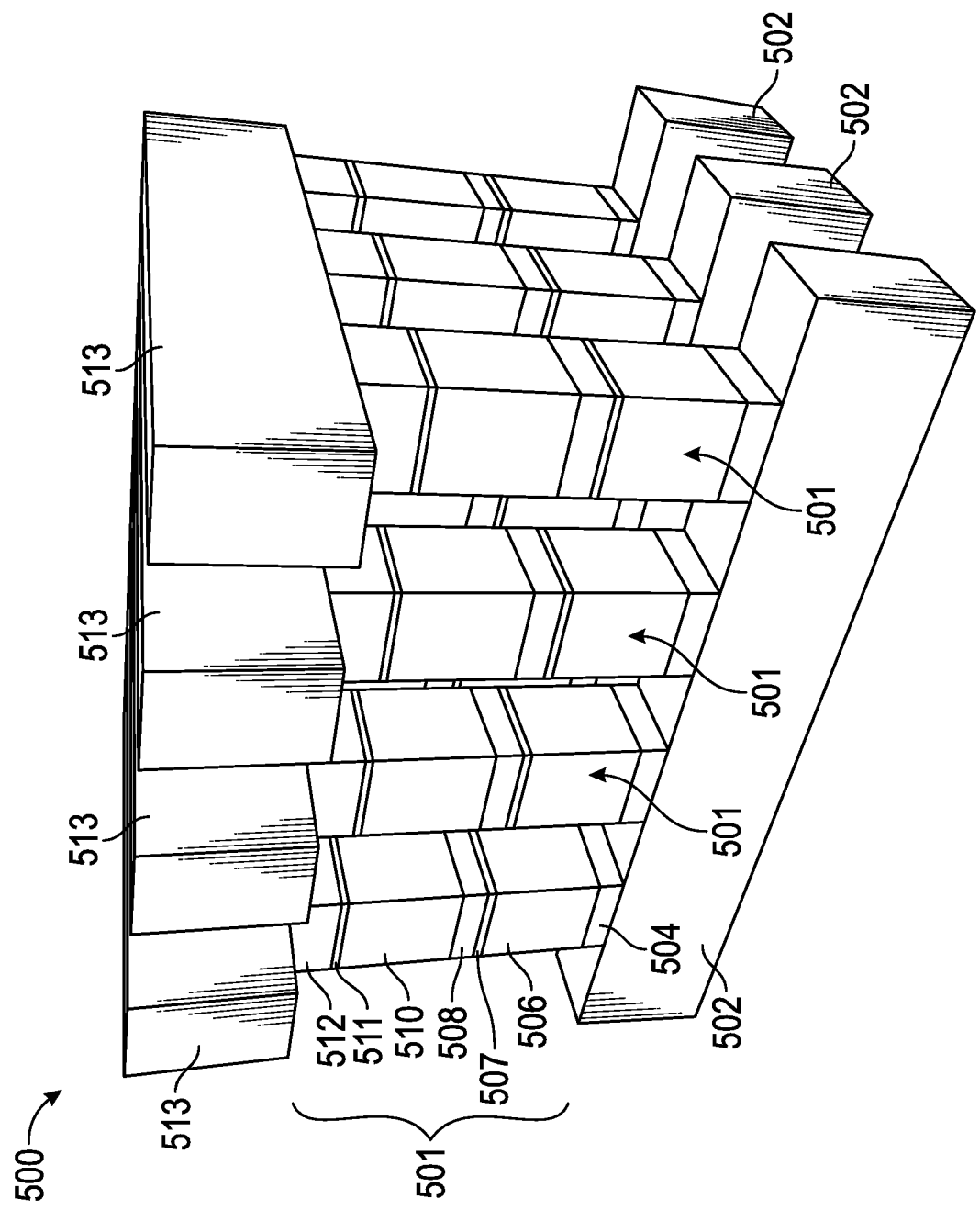
FIG. 5 includes a transistorless non-volatile memory in an embodiment.

FIG. 5 includes a transistorless non-volatile memory array 500. More specifically, FIG. 5 depicts a perspective view of one exemplary embodiment of a portion of a MTJ-based STTRAM array 500. Some magnetic memories, such as STTRAM, utilize a MTJ for switching and detection of the memory's magnetic state. FIG. 5 includes a MTJ consisting of ferromagnetic (FM) layers 510, 512 and tunneling barrier 511 (e.g., magnesium oxide (MgO)). The MTJ couples BL 513 to the selection switch made up by layers 508, 507, 506, 504 (e.g., low $V_h$ selector switch), and WL 502. Memory 501 is "read" by assessing the change of resistance (e.g., tunneling magnetoresistance (TMR)) for different relative magnetizations of FM layers 510, 512.

More specifically, MTJ resistance is determined by the relative magnetization directions of layers 510, 512. When the magnetization directions between the two layers are anti-parallel, the MTJ is in a high resistance state. When the magnetization directions between the two layers are parallel, the MTJ is in a low resistance state. Layer 510 is the "reference layer" or "fixed layer" because its magnetization direction is fixed. Layer 512 is the "free layer" because its magnetization direction is changed by passing a driving current polarized by the reference layer (e.g., a positive voltage applied to layer 510 rotates the magnetization direction of layer 512 opposite to that of layer 510 and negative voltage applied to layer 510 rotates the magnetization direction of layer 510 to the same direction of layer 512).

One form of memory 500 includes perpendicular (pSTTRAM). Where a traditional MTJ or non-perpendicular MTJ generates a magnetization "in plane" (with which "high" and "low" memory states are set), a perpendicular MTJ (pMTJ) generates magnetization "out of plane". This reduces the switching current needed to switch between high and low memory states. This also allows for better scaling (e.g., smaller size memory cells). The MTJ is converted to a pMTJ by, for example, thinning the free layer 512, thereby making the tunnel barrier/free layer interface more dominant in magnetic field influence (and the interface promotes anisotropic out of plane magnetization).

Memory 500 can be, but is not limited to, part of a solid-state memory array or a solid-state drive. Memory 500 comprises a plurality of memory cells 501 that are each arranged in a column (or pillar), of which only a few are indicated. Additionally, it should be understood that a dielectric material that is normally between memory cells 501 is not shown in FIG. 5 for clarity.

Each memory cell 501 comprises an electrode 504 (e.g., Pd) formed on a word line metallization 502. An ALD deposited solid electrolyte (e.g., $HfO_2$, $Al_2O_3$, $Nb_2O_5$, and the like) 506 is formed on electrode 504. Active electrode layer 507 (e.g., Ag,) is formed on layer 506. In some embodiments layers 506, 507 directly contact each other. An electrode/metallization layer 508 (e.g., Pd) is formed on electrode layer 507.

In an embodiment, word line metallization layer 502 and bit line metallization layer 513 are formed from, for example, tungsten, copper and/or aluminum. In one exemplary embodiment, electrode layer 512 is a composite electrode that is formed from, for example, carbon (C) and/or titanium nitride (TiN).

FIG. 5 depicts a schematic diagram of an exemplary embodiment of a cross-point memory array 500 comprising a plurality of memory cells 501. Memory cells 501 are located at intersections of column signal lines 502 (e.g., word lines) and row signal lines 513 (e.g., bit lines). Individual column and/or row signal lines are electrically connected in a well-known manner to a memory controller (not shown) to selectively operate memory cells 501 in a well-known manner. It should be understood that memory array 500 can comprise part of a solid-state memory array or a solid-state drive that is coupled in a well-known manner to a computer system or an information-processing system (not shown).

Device 501 has a high $I_{on}/I_{off}$ ratio at V/2 (where $I_{on}/I_{off}$ ratio is, e.g., $1\times10^6$). Such a high $I_{on}/I_{off}$ ratio at V/2 (e.g., $1\times10^{5-6}$ for an embodiment versus $1\times10^{2-3}$ for conventional systems) results in improved device performance. Device 501 includes a low $V_h$ as well as a low $V_{th}$. A low $V_{th}$ helps improve a write margin, providing more available current to switch the MTJ between parallel and antiparallel states (e.g., to switch the MTJ from a "0" state to a "1" state, which requires a relatively large write current). The lower $V_{th}$ may also help prevent oxide breakdown for the middle tunneling layer 511 of the MTJ. Also, the low $V_h$ helps allow for a lower $V_{th}$ and for a greater spread between the $V_h$ and $V_{th}$. Embodiments described herein may have a $V_h$ of 0.15 V whereas more conventional selector switches (e.g., MIT or MOTT or chalcogenide based selector switches) have a $V_h$ of almost 1 V, leaving less write margin. The low $V_{th}$ may be used along with other techniques (e.g., WL boosting) to generate sufficient write current for the MTJ. Such a selector (e.g., FIG. 2) operates with sub 100 ns pulses and/or sub 10 uA current to begin filament formation.

FIGS. 4 and 5 depict arrays that include circuits fabricated in the array periphery to enable selector functionality. In particular the circuits include current limiters to ensure the current through the selector device does not exceed predetermined values (e.g., 30, 50 or 100 uA). A current mirror is an example of such circuit.

Materials for the layers 504, 506, 507, 508 (respectively analogous to layers 203, 202, 204, 201 of FIG. 2) are as described above with regard to FIG. 2.

Figure 6:
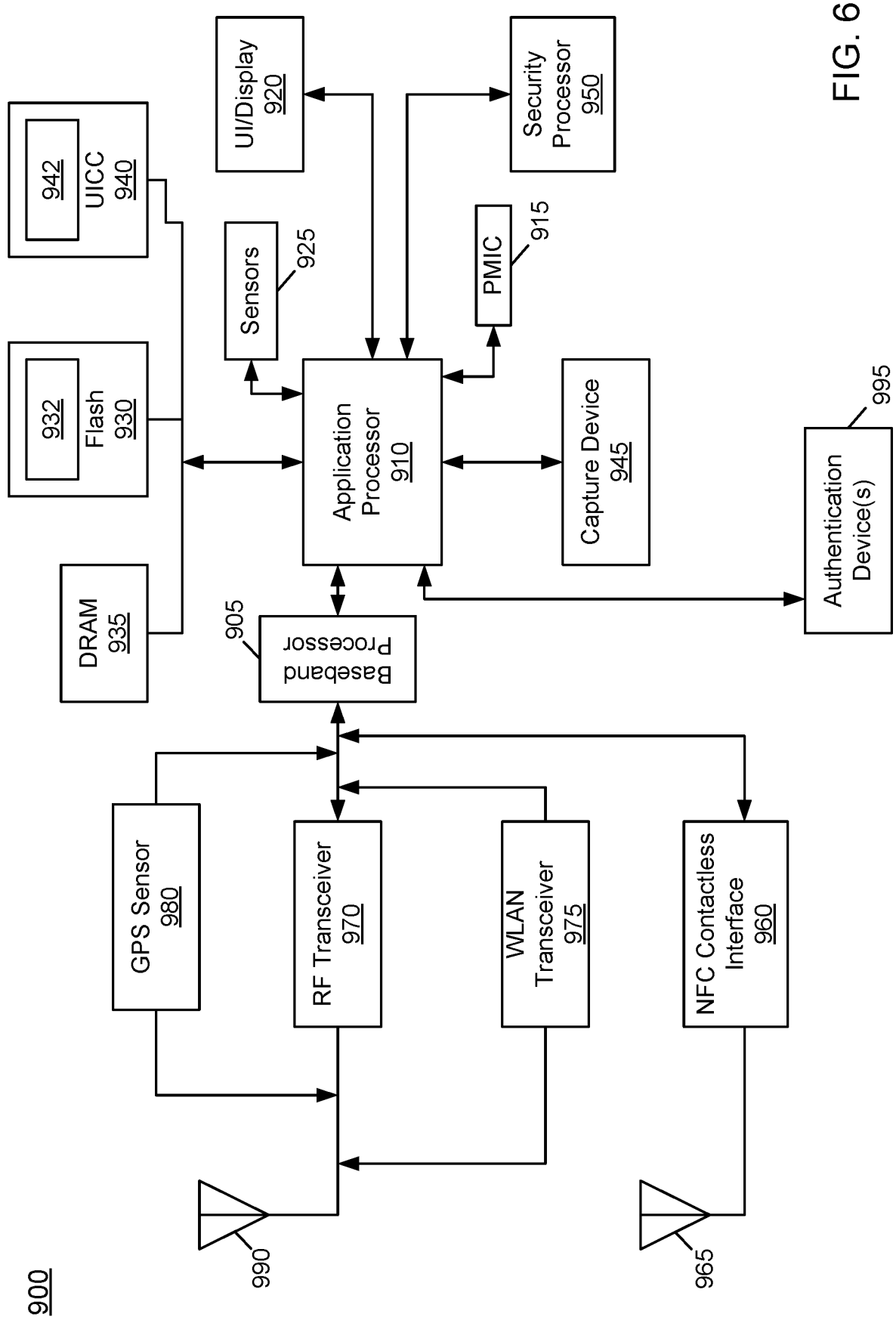
FIGS. 6, 7, and 8 include systems that include embodiments.
Figure 7:
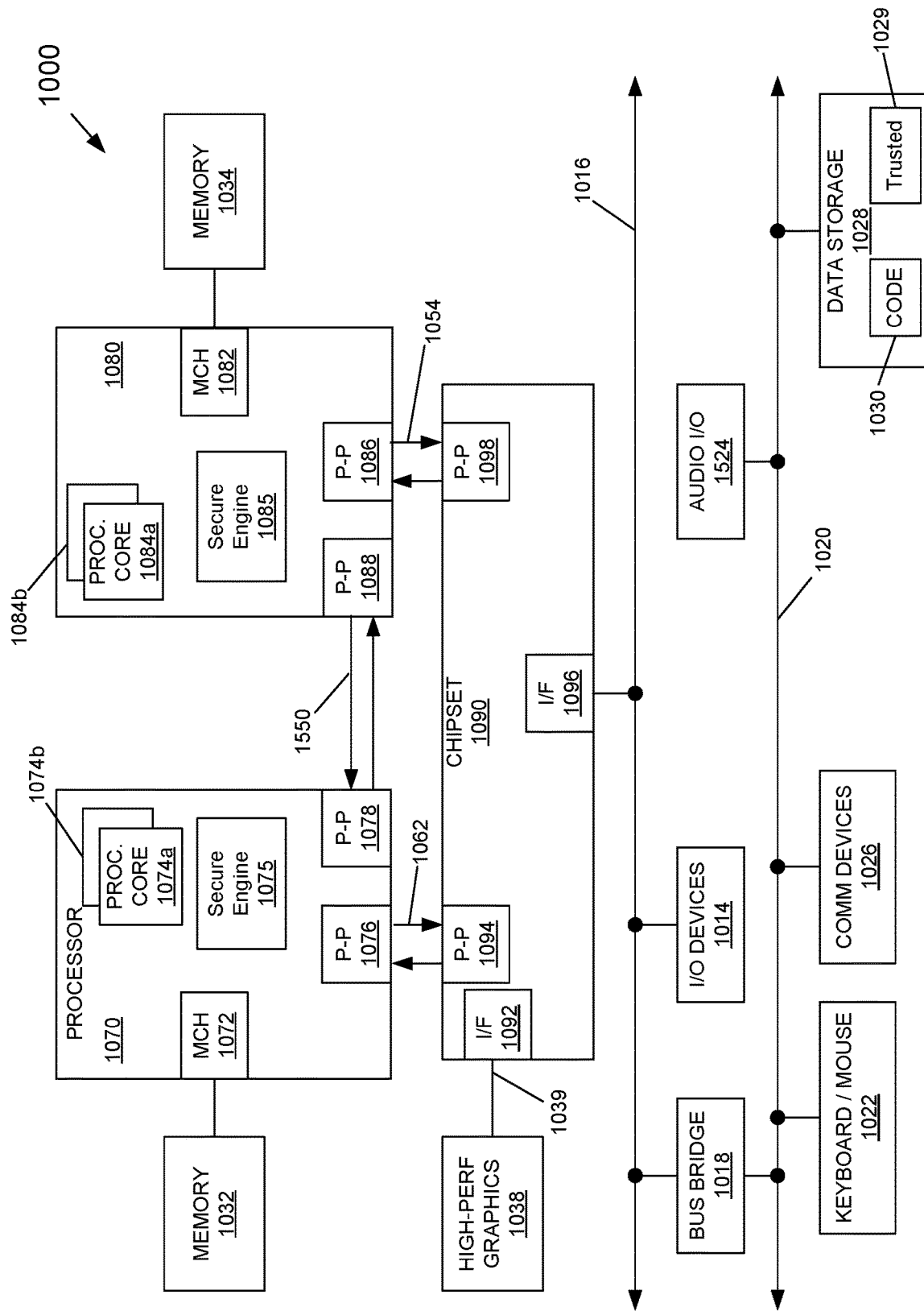
Figure 8:
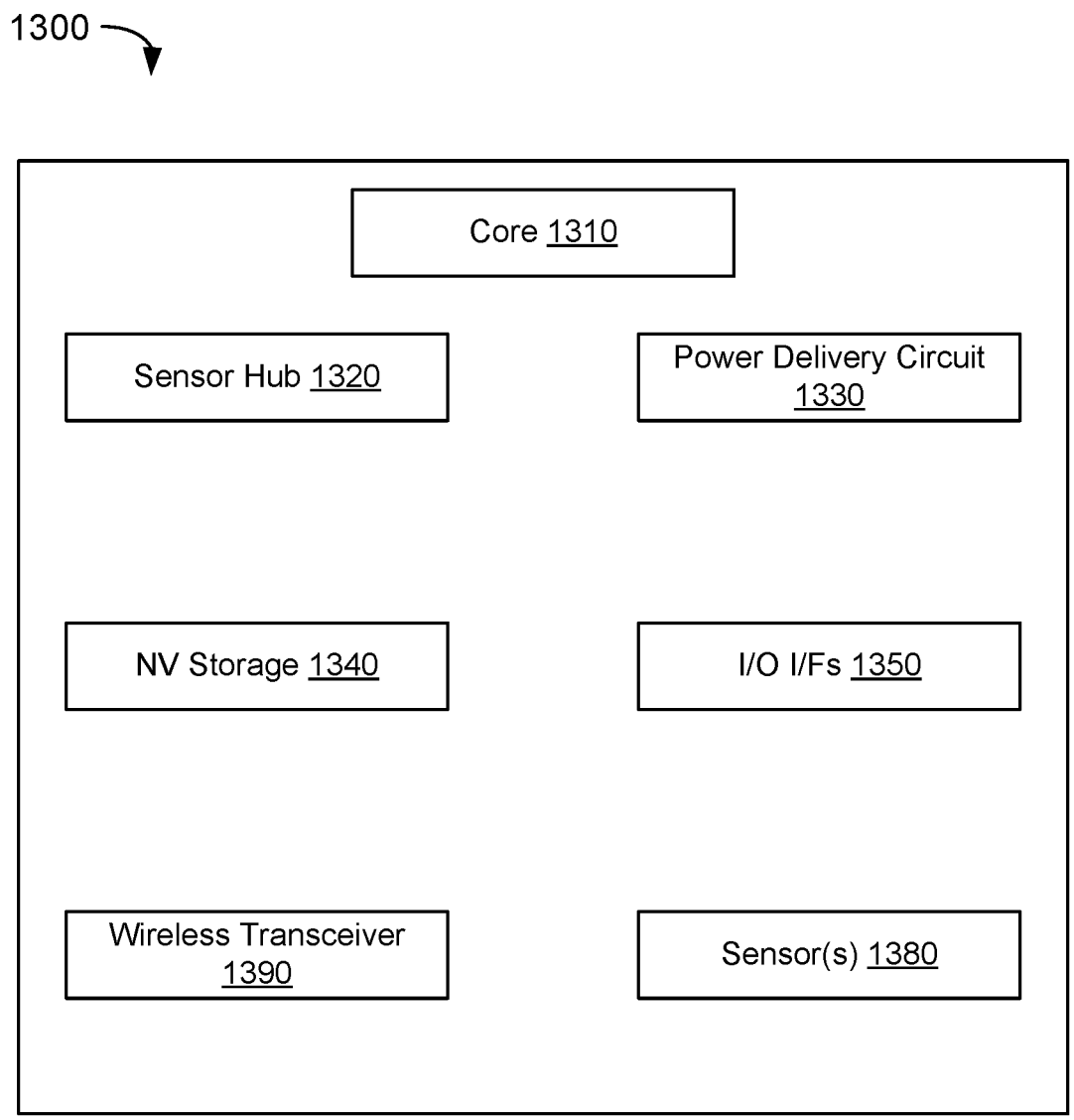

FIGS. 6, 7, 8 each include a system that may include any of the above described embodiments. FIGS. 6, 7, and 8 include block diagrams of systems 900, 1000, 1300 in accordance with embodiments. Each of those systems may include hundreds or thousands of the above described selector switches (e.g., FIG. 2) and be critical to functions (e.g., memory functions of memories that include such selector switches) in those systems. The selector switches may be included in, for example, elements 910, 930, 1070, 1032, 1090, 1310, 1340, 1380, and the like. Systems 900, 1000, 1300 may be included in, for example, a mobile computing node such as a cellular phone, smartphone, tablet, Ultrabook®, notebook, laptop, personal digital assistant, and mobile processor based platform. The size savings and power efficiency of such devices accumulates when, for example, the selector switch based memories are deployed in mass and provides significant performance advantages to such computing nodes.

Referring now to FIG. 6, shown is a block diagram of an example system with which embodiments can be used. As seen, system 900 may be a smartphone or other wireless communicator or any other IoT device. A baseband processor 905 is configured to perform various signal processing with regard to communication signals to be transmitted from or received by the system. In turn, baseband processor 905 is coupled to an application processor 910, which may be a main CPU of the system to execute an OS and other system software, in addition to user applications such as many well-known social media and multimedia apps. Application processor 910 may further be configured to perform a variety of other computing operations for the device.

In turn, application processor 910 can couple to a user interface/display 920, e.g., a touch screen display. In addition, application processor 910 may couple to a memory system including a non-volatile memory, namely a flash memory 930 and a system memory, namely a DRAM 935. In some embodiments, flash memory 930 may include a secure portion 932 in which secrets and other sensitive information may be stored. As further seen, application processor 910 also couples to a capture device 945 such as one or more image capture devices that can record video and/or still images.

A universal integrated circuit card (UICC) 940 comprises a subscriber identity module, which in some embodiments includes a secure storage 942 to store secure user information. System 900 may further include a security processor 950 that may couple to application processor 910. A plurality of sensors 925, including one or more multi-axis accelerometers may couple to application processor 910 to enable input of a variety of sensed information such as motion and other environmental information. In addition, one or more authentication devices 995 may be used to receive, e.g., user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more IoT networks, various circuitries may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals, e.g., AM/FM and other signals may also be provided. In addition, via WLAN transceiver 975, local wireless communications, such as according to a Bluetooth™ or IEEE 802.11 standard can also be realized.

Referring now to FIG. 7, shown is a block diagram of a system in accordance with another embodiment of the present invention. Multiprocessor system 1000 is a point-to-point interconnect system such as a server system, and includes a first processor 1070 and a second processor 1080 coupled via a point-to-point interconnect 1050. Each of processors 1070 and 1080 may be multicore processors such as SoCs, including first and second processor cores (i.e., processor cores 1074*a* and 1074*b* and processor cores 1084*a* and 1084*b*), although potentially many more cores may be present in the processors. In addition, processors 1070 and 1080 each may include a secure engine 1075 and 1085 to perform security operations such as key management, attestations, IoT network onboarding or so forth.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034, which may be portions of main memory (e.g., a DRAM) locally attached to the respective processors. First processor 1070 and second processor 1080 may be coupled to a chipset 1090 via P-P interconnects 1052 and 1054, respectively. As shown in FIG. 6, chipset 1090 includes P-P interfaces 1094 and 1098.

Furthermore, chipset 1090 includes an interface 1092 to couple chipset 1090 with a high performance graphics engine 1038, by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 such as a non-volatile storage or other mass storage device. As seen, data storage unit 1028 may include code 1030, in one embodiment. As further seen, data storage unit 1028 also includes a trusted storage 1029 to store sensitive information to be protected. Further, an audio I/O 1024 may be coupled to second bus 1020.

Embodiments may be used in environments where Internet of Things (IoT) devices may include wearable devices or other small form factor IoT devices. Referring now to FIG. 8, shown is a block diagram of a wearable module 1300 in accordance with another embodiment. In one particular implementation, module 1300 may be an Intel® Curie™ module that includes multiple components adapted within a single small module that can be implemented as all or part of a wearable device. As seen, module 1300 includes a core 1310 (of course in other embodiments more than one core may be present). Such core may be a relatively low complexity in-order core, such as based on an Intel Architecture® Quark™ design. In some embodiments, core 1310 may implement a TEE as described herein. Core 1310 couples to various components including a sensor hub 1320, which may be configured to interact with a plurality of sensors 1380, such as one or more biometric, motion environmental or other sensors. A power delivery circuit 1330 is present, along with a non-volatile storage 1340. In an embodiment, this circuit may include a rechargeable battery and a recharging circuit, which may in one embodiment receive charging power wirelessly. One or more input/output (I/O) interfaces 1350, such as one or more interfaces compatible with one or more of USB/SPI/I2C/GPIO protocols, may be present. In addition, a wireless transceiver 1390, which may be a Bluetooth™ low energy or other short-range wireless transceiver is present to enable wireless communications as described herein. Understand that in different implementations a wearable module can take many other forms. Wearable and/or IoT devices have, in comparison with a typical general purpose CPU or a GPU, a small form factor, low power requirements, limited instruction sets, relatively slow computation throughput, or any of the above.

Various embodiments include a semiconductive substrate. Such a substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

The following examples pertain to further embodiments.

Example 1 includes a top electrode and a bottom electrode; a metal layer between the top and bottom electrodes; and a solid electrolyte (SE) layer between the metal layer and the bottom electrode; wherein (a) the metal layer includes silver (Ag), and (b) Ag ions from the metal layer form a conductive path in the SE layer when the top electrode is biased and disband the conductive path when the top electrode is not biased.

In example 2 the subject matter of the Example 1 can optionally include, wherein the metal layer directly contacts the SE layer.

In example 3 the subject matter of the Examples 1-2 can optionally include comprising a memory cell in series with a selector switch that includes the top and bottom electrodes, the metal layer, and the SE layer.

In example 4 the subject matter of the Examples 1-3 can optionally include wherein the memory cell includes a magnetic tunnel junction (MTJ).

In example 5 the subject matter of the Examples 1-4 can optionally include wherein the SE layer is less than 4 nm thick.

However, other embodiments may include a SE less than 3 nm.

These are critical dimensions needed to lower $V_h$ and $V_{th}$ to a point that is compatible with MTJs.

In example 6 the subject matter of the Examples 1-5 can optionally include wherein the SE layer includes an aluminum oxide.

In example 7 the subject matter of the Examples 1-6 can optionally include wherein the bottom electrode includes a non-reactive metal selected from the group comprising: Ru, Rh, Pd, Ir, and Pt.

In example 8 the subject matter of the Examples 1-7 can optionally include wherein the selector switch includes a holding voltage ($V_h$) of less than 0.2 V and threshold voltage ($V_{th}$) of less than 1 V.

These are critical dimensions needed to provide a selector switch that is compatible with MTJs.

In example 9 the subject matter of the Examples 1-8 can optionally include wherein the selector switch includes an $I_{on}/I_{off}$ ratio of at least $1 \times 10^5$.

In example 10 the subject matter of the Examples 1-9 can optionally include comprising a barrier layer between the metal layer and the top electrode.

In example 11 the subject matter of the Examples 1-10 can optionally include comprising bit and write lines, wherein: the top electrode couples to one of the bit and write lines and the bottom electrode couples to another of the bit and write lines; and the memory cell is between one of the top and bottom electrodes and one of the bit and write lines.

In example 12 the subject matter of the Examples 1-11 can optionally include wherein the metal layer includes an alloy of the silver and an additional metal selected from the group comprising Palladium, Platinum, Tungsten, Cobalt, and Aluminum.

In example 13 the subject matter of the Examples 1-11 can optionally include wherein the metal layer includes an alloy of the silver and an additional metal.

In example 14 the subject matter of the Examples 1-13 can optionally include wherein the SE layer includes at least one member selected from the group comprising $Al_2O_3$, $HfO_2$, $SiO_2$, $ZrO_2$, and $TiO_2$.

In example 15 the subject matter of the Examples 1-14 can optionally include a transistor having a gate electrode, a source region, and a drain region; and one of the top and bottom electrodes is coupled to one of the source and drain regions.

In example 16 the subject matter of the Examples 1-15 can optionally include a hybrid phase field effect transistor (HP-FET) comprising the transistor and a selector switch that includes: the top and bottom electrodes, the metal layer, and the SE layer.

In example 17 the subject matter of the Examples 1-16 can optionally include comprising a selector switch that includes the top and bottom electrodes, the metal layer, and the SE layer; wherein the selector switch has a variable resistance with a high resistance threshold above which the transistor does not turn on, and a low resistance threshold below which the transistor does not turn off.

In example 18 the subject matter of the Examples 1-17 can optionally include comprising a selector switch that includes the top and bottom electrodes, the metal layer, and the SE layer; wherein the selector switch is connected in series with the transistor.

In example 19 the subject matter of the Examples 1-18 can optionally include wherein another of the source and drain regions is coupled to one of a ground and a supply node.

In example 20 the subject matter of the Examples 1-19 can optionally include a memory; and a processor coupled to the memory, wherein at least one of the processor and the memory include an apparatus according to any one of examples 1 to 19.

Example 21 includes memory array comprising: a selector switch including top and bottom electrodes, a metal layer, and a solid electrolyte layer; a memory cell in series with the selector switch; bit and write lines, wherein (a) (i) the top electrode couples to one of the bit and write lines and the bottom electrode couples to another of the bit and write lines, and (a) (ii) the memory cell is between one of the top and bottom electrodes and one of the bit and write lines; wherein (b) (i) the metal layer includes silver (Ag), and (b) (ii) Ag ions from the metal layer form a conductive path in the SE layer when the top electrode is biased and disband the conductive path when the top electrode is not biased.

In example 22 the subject matter of the Example 21 can optionally include wherein the memory cell includes a perpendicular magnetic tunnel junction (pMTJ).

In example 23 the subject matter of the Examples 21-22 can optionally include a current limiter to limit current through the selector switch to less than a pre-determined value.

For example, such a value includes 30, 50, or 100 uA. A current mirror is an example of such a current limiter.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
    a top electrode and a bottom electrode;
    a metal layer between the top and bottom electrodes; and
    a solid electrolyte (SE) layer between the metal layer and the bottom electrode;
    wherein (a) the metal layer includes silver (Ag), and (b) Ag ions from the metal layer form a conductive path in the SE layer when the top electrode is biased and disband the conductive path when the top electrode is not biased.

2. The apparatus of claim 1, wherein the metal layer directly contacts the SE layer.

3. The apparatus of claim 2, comprising a memory cell in series with a selector switch that includes the top and bottom electrodes, the metal layer, and the SE layer.

4. The apparatus of claim 3, wherein the memory cell includes a magnetic tunnel junction (MTJ).

5. The apparatus of claim 4, wherein the SE layer is less than 4 nm thick.

6. The apparatus of claim 5, wherein the SE layer includes an aluminum oxide.

7. The apparatus of claim 6, wherein the bottom electrode includes a nonreactive noble metal, the nonreactive noble metal including at least one of Ru, Rh, Pd, Ir, Pt, or combinations thereof.

8. The apparatus of claim 4, wherein the selector switch includes a holding voltage ($V_h$) of less than 0.2 V and a threshold voltage ($V_{th}$) of less than 1 V.

9. The apparatus of claim 8, wherein the selector switch includes an $I_{on}/I_{off}$ ratio of at least $1 \times 10^5$.

10. The apparatus of claim 4 comprising a barrier layer between the metal layer and the top electrode.

11. The apparatus of claim 4 comprising bit and write lines, wherein:
    the top electrode couples to one of the bit or write lines and the bottom electrode couples to another of the bit or write lines; and
    the memory cell is between one of the top or bottom electrodes and one of the bit or write lines.

12. The apparatus of claim 2, wherein the metal layer includes an alloy of the silver and an additional metal, the additional metal including at least one of Palladium, Platinum, Tungsten, Cobalt, Aluminum, or combinations thereof.

13. The apparatus of claim 2, wherein the SE layer includes at least one of $Al_2O_3$, $HfO_2$, $SiO_2$, $ZrO_2$, $TiO_2$, or combinations thereof.

14. The apparatus of claim 2 comprising:
a transistor having a gate electrode, a source region, and a drain region; and
one of the top or bottom electrodes is coupled to one of the source or drain regions.

15. The apparatus of claim 14 comprising a hybrid phase field effect transistor (HP-FET) comprising the transistor and a selector switch that includes: the top and bottom electrodes, the metal layer, and the SE layer.

16. The apparatus of claim 14, comprising a selector switch that includes the top and bottom electrodes, the metal layer, and the SE layer; wherein the selector switch has a variable resistance with a high resistance threshold above which the transistor does not turn on, and a low resistance threshold below which the transistor does not turn off.

17. The apparatus of claim 14 comprising a selector switch that includes the top and bottom electrodes, the metal layer, and the SE layer; wherein the selector switch is connected in series with the transistor.

18. The apparatus of claim 17 wherein another of the source and drain regions is coupled to one of a ground or a supply node.

19. A system comprising:
a memory; and
a processor coupled to the memory,
wherein at least one of the processor and the memory include an apparatus according to claim 1.

20. A memory array comprising:
a selector switch including top and bottom electrodes, a metal layer, and a solid electrolyte layer;
a memory cell in series with the selector switch;
bit and write lines,
wherein (a)(i) the top electrode couples to one of the bit or write lines and the bottom electrode couples to another of the bit or write lines, and (a)(ii) the memory cell is between one of the top or bottom electrodes and one of the bit or write lines;
wherein (b)(i) the metal layer includes silver (Ag), and (b)(ii) Ag ions from the metal layer form a conductive path in the SE layer when the top electrode is biased and disband the conductive path when the top electrode is not biased.

21. The array of claim 20, wherein the memory cell includes a perpendicular magnetic tunnel junction (pMTJ).

22. The array of claim 21 comprising a current limiter to limit current through the selector switch to less than a pre-determined value.

* * * * *